United States Patent
Hasegawa et al.

(10) Patent No.: US 6,770,899 B2
(45) Date of Patent: Aug. 3, 2004

(54) WORK PIECE FEEDING MACHINE

(75) Inventors: Tsuyoshi Hasegawa, Nagano (JP); Yasuhide Denda, Nagano (JP)

(73) Assignee: Fujikoshi Machinery Corp., Nagano (JP)

( * ) Notice: Subject to any disclaimer, the term of this patent is extended or adjusted under 35 U.S.C. 154(b) by 86 days.

(21) Appl. No.: 10/128,753

(22) Filed: Apr. 23, 2002

(65) Prior Publication Data

US 2002/0153477 A1 Oct. 24, 2002

(30) Foreign Application Priority Data

Apr. 23, 2001 (JP) .......................................... 2001-124476

(51) Int. Cl.$^7$ ............................................. G01N 21/86
(52) U.S. Cl. ............................. 250/559.29; 250/559.36; 250/225
(58) Field of Search ............................. 250/225, 559.29, 250/559.3, 559.33, 559.35, 559.36, 559.37, 221

(56) References Cited

U.S. PATENT DOCUMENTS 5,343,049 A * 8/1994 Vareille et al. ......... 250/559.29
6,053,983 A * 4/2000 Saeki et al. ................ 118/728

FOREIGN PATENT DOCUMENTS

| JP | 3-29083 | 6/1991 |
| JP | 10-41392 | 2/1998 |

* cited by examiner

Primary Examiner—Thanh X. Luu
(74) Attorney, Agent, or Firm—Jordan and Hamburg LLP

(57) ABSTRACT

Work piece feeding machine capable of correctly and efficiently setting a work piece in a through-hole of a carrier. The machine includes a positioning unit which detects the amount of displacement of the work piece with respect to the through-hole and corrects the position of the work piece in the though-hole. The positioning unit includes: a lighting source provided on the work piece side or the carrier side and directing polarized light on the work piece and the carrier; a camera provided on the carrier side or the work piece side and receiving the polarized light from the lighting source so as to catch images of an out edge of the work piece and an inner edge of the through-hole in a visual field thereof; and an image processor which measures the amount of displacement on the basis of positions of the outer edge and the inner edge.

9 Claims, 7 Drawing Sheets

WORK PIECE FEEDING MACHINE

BACKGROUND OF THE INVENTION

The present invention relates to a work piece feeding machine, more precisely relates to a work piece feeding machine capable of feeding a work piece or work pieces together with a carrier.

Abrasive machines are widely used to polishing semiconductor wafers or lapping glass, crystal, etc. In the abrasive machine, work pieces, e.g., semiconductor wafers, are set in prescribed positions of the machine. The abraded work pieces are discharged from the abrasive machine. Setting and discharging the work pieces are executed by a work piece feeding machine. However, it is difficult to correctly position the work pieces in the abrasive machine.

Conventionally, the work pieces are chucked and set in through-holes of a carrier by a multi-joint robot (see Japanese Utility Model Gazette No. 3-29083). In this case, the work pieces are set in the carrier which has been previously set in the abrasive machine, or the carrier, in which the work pieces have been previously set, is set in the abrasive machine.

Further, positions of the work pieces are corrected when the work pieces are set. The correction is executed by the steps of: setting the work piece in a setting section of the abrasive machine; detecting positions of an outer edge of the work piece and an inner edge of the setting section; measuring a distance between both edges; and adjusting the distance so as to correct the position of the work piece in the setting section (see Japanese Patent Gazette No. 10-41372). In this case, a plurality of monitors are provided along the edges with regular angular separations, e.g., 120°, and the distances detected by the monitors are made equal by correcting the position of the work piece.

In the case of setting the carrier, in which the work pieces have been set, in the abrasive machine, the work pieces should be correctly set in the through-holes. If the carrier is made of a half-transparent material, difference of light intensity between the carrier and the through-holes is small, so it is difficult to stably detect the through-holes by optical means. To stably detect the through-holes, an expensive image processing unit is required, marks are provided to the carrier, and at least three cameras are provided for one work piece.

SUMMARY OF THE INVENTION

An object of the present invention is to provide a work piece feeding machine capable of correctly and efficiently setting a work piece in a through-hole of a carrier and feeding the carrier to a machine for a further step.

Another object is to provide an abrasive system capable of efficiently abrading a work piece.

To achieve the object, the present invention has following structures.

The work piece feeding machine of the present invention, which sets a work piece into a through-hole of a carrier and feeds the carrier holding the work piece to a machine for further treatment, comprises:
 a loading unit for feeding the work piece to the through-hole of the carrier; and
 a positioning unit detecting amount of displacement of the work piece with respect to the through-hole at a detecting position and correcting the position of the work piece in the through-hole on the basis of the detected amount of the displacement thereof, wherein the positioning unit includes:
 a lighting source section being provided on the work piece side or the carrier side, the lighting source section throwing polarized light on the work piece and the carrier at the detecting position;
 a camera being provided on the carrier side or the work piece side, the camera receiving the polarized light from the lighting source section with selecting a polarizing direction so as to catch images of an outer edge of the work piece and an inner edge of the through-hole in a visual field thereof; and
 an image processing section measuring the amount of displacement of the work piece with respect to the through-hole on the basis of positions of the outer edge of the work piece and the inner edge of the through-hole in the visual field.

In the work piece feeding machine, the work piece and the carrier are provided between the lighting source section and the camera, and the work piece and the through-hole of the carrier are detected by polarized light. Therefore, the amount of displacement of the work piece with respect to the through-hole can be correctly measured without reference to surface conditions of the work piece and the carrier. By correcting the position of the work piece on the basis of the amount of displacement, the work piece can be positioned with high positioning accuracy.

In the work piece feeding machine, a plurality of the cameras may be located with angular separation of 90° and capable of detecting a center of the work piece and a center of the through-hole of the carrier. With this structure, data in the visual field can be efficiently analyzed. The amount of displacement of a center of the work piece with respect to a center of the through-hole in the X-Y directions can be easily measured, so that the work piece can be correctly set in the through-hole.

In the work piece feeding machine, the image processing section may detect the amount of displacement of the work piece with respect to the through-hole on the basis of difference between intensity of direct light, which is emitted from the lighting source section via a gap between the outer edge of the carrier and the inner edge of the through-hole, and intensity of transmitted light, which has transmitted through the work piece and/or the carrier.

In the work piece feeding machine, the lighting source section and the camera respectively may have polarizing filters. By employing the polarizing filters, a direction of a transmission axis (a polarizing axis) can be easily adjusted, so that the amount of displacement of the work piece with respect to the through-hole can be correctly measured by the difference of light intensity.

The abrasive system of the present invention comprises:
 an abrasive machine for abrading a work piece;
 a sucking mechanism for holding the carrier by vacuum means, the sucking mechanism including a sucking board whose shape is similar to that of the carrier;
 a work piece feeding mechanism, which sets a work piece into a through-hole of a carrier and feeds the carrier, which is held by the sucking board;
 an accommodating mechanism for accommodating the work piece abraded by the abrasive machine; and
 a conveying mechanism for conveying the sucking board to the abrasive machine, the work piece feeding mechanism and the accommodating mechanism.

BRIEF DESCRIPTION OF THE DRAWINGS

Embodiments of the present invention will now be described by way of examples and with reference to the accompanying drawings, in which.

DETAILED DESCRIPTION OF THE EMBODIMENTS

Preferred embodiments of the present invention will now be described in detail with referenced to the accompanying drawings.

Figure 1:
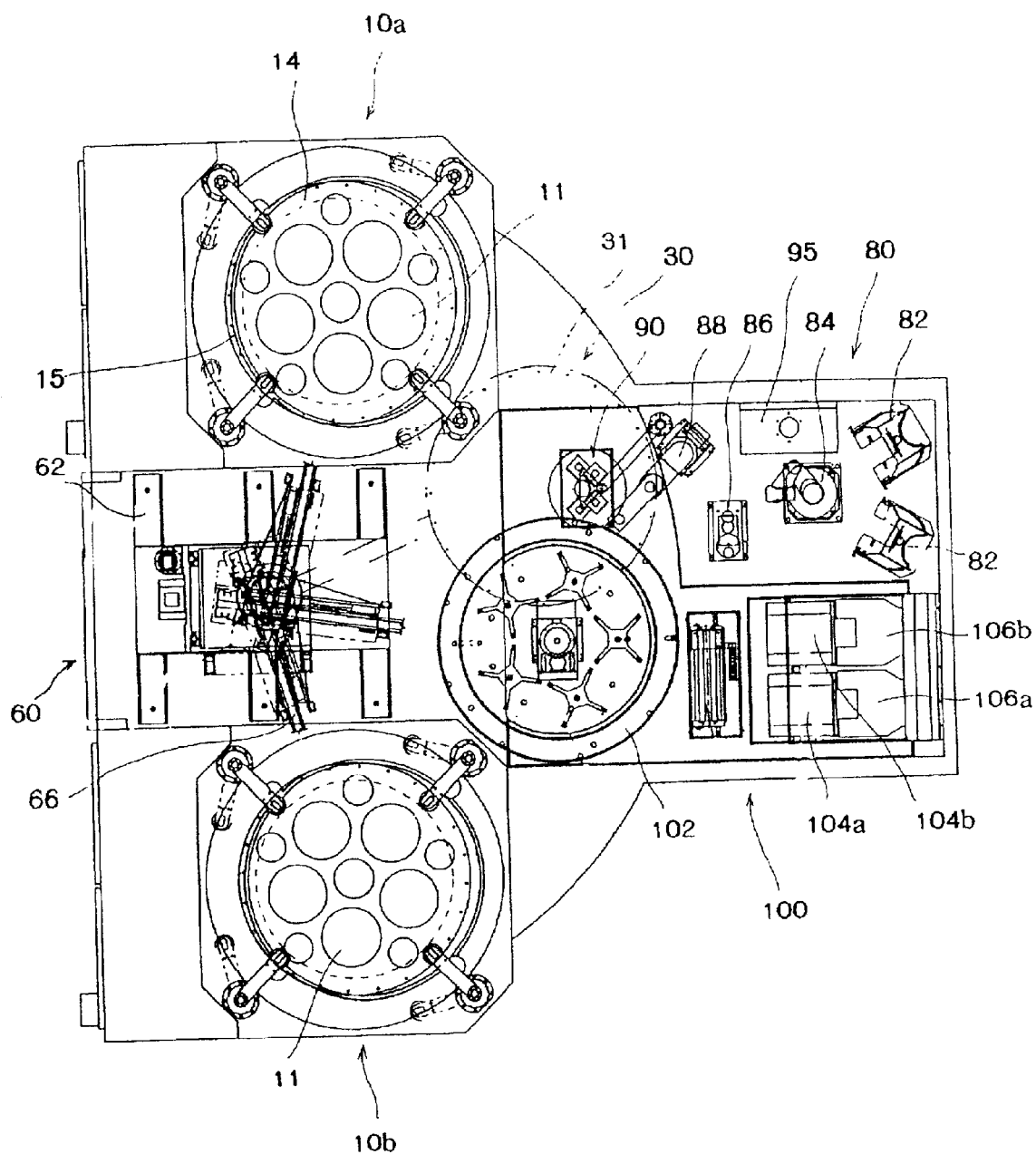
FIG. 1 is a plan view of an abrasive system including the work piece feeding machine of the present invention.

FIG. 1 shows an example of an abrasive system including the work piece feeding machine of the present invention.

Firstly, an outline of the abrasive system will be explained, then details of the work piece feeding machine will be explained.

In the abrasive system shown in FIG. 1, carriers 14, each of which holds work pieces 11, are fed to and discharged from abrasive machines 10a and 10b. The abrasive system comprises: a sucking mechanism 30 including a sucking board 31, which is capable of holding the carrier 14 together with the work pieces 11; a feeding mechanism 80 capable of setting the work pieces 11 in through-holes of the carrier 14 held by the sucking board 31; an accommodating mechanism 100 for accommodating the abraded work pieces 11; the abrasive machines 10a and 10b; and a conveying mechanism 60 for conveying the sucking mechanism 30 to the feeding mechanism 80 and the accommodating mechanism 100.

The abrasive machines 10a and 10b are capable of polishing both surfaces of each work piece 11, e.g., a silicon wafer, set in the through-hole of the carrier 14. The work pieces 11 are sandwiched by an upper polishing plate and a lower polishing plate so that both surfaces of each work piece 11 can be polished. Carrier holders 15 respectively hold outer edges of the carriers 14. The carriers 14 are respectively moved along circular orbits without spinning, so that the work pieces 11 held in the through-holes of the carriers 14 are also respectively moved along circular orbits without spinning. By moving the work pieces 11 without spinning, both surfaces of the work pieces 11, which are held by the carriers 14, can be polished by polishing faces of the abrasive plates.

A sucking mechanism 30 feeds the carrier 14 and the work pieces 11 to and discharges them from the abrasive machines 10a and 10b. A sucking board 31, whose diameter is greater than that of the carrier 14, sucks and holds the carrier 14 holding the work pieces 11.

Figure 2:
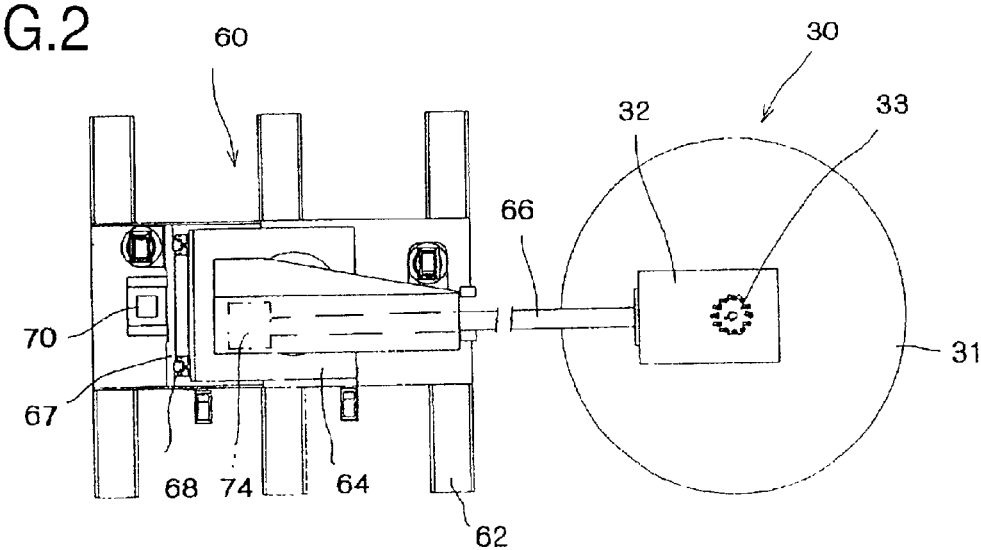
FIG. 2 is a plan view of a sucking mechanism and a conveying mechanism.

FIG. 2 is a plan view in which the conveying mechanism 60 holds the sucking mechanism 30. The conveying mechanism 60 turns the sucking mechanism 30 in a horizontal plane so as to convey the sucking mechanism 30 to the abrasive machines 10a and 10b, the feeding mechanism 80 and the accommodating mechanism 100. In the conveying mechanism 60, a holding base 64 is provided to a base member 62 and can be moved in the vertical direction. A carrier arm 66 is provided to the holding base 64 and can be turned. The sucking board 31 is provided to a front end of the carrier arm 66 with a joint section 32.

A vertical plate 67 is vertically provided to the base member 62. Slide guides 68 for vertically guiding the holding base 64 are provided to the holding base 64. The holding base 64 is vertically moved by a servo motor 70. The carrier arm 66 is pivotably connected to the holding base 64 and turned by a servo motor 74, which is provided to a base end of the carrier arm 66. The turn of the carrier arm 66 is synchronized with an inverting action of the sucking board 31. By the inverting action, a sucking face of the sucking board 31 can be headed upward and downward.

The joint section 32 includes a rotary joint 33 for rotatably holding the sucking board 31 and connects vacuum circuits of the sucking board 31 to an external vacuum unit via the conveying mechanism 60.

Figure 3:
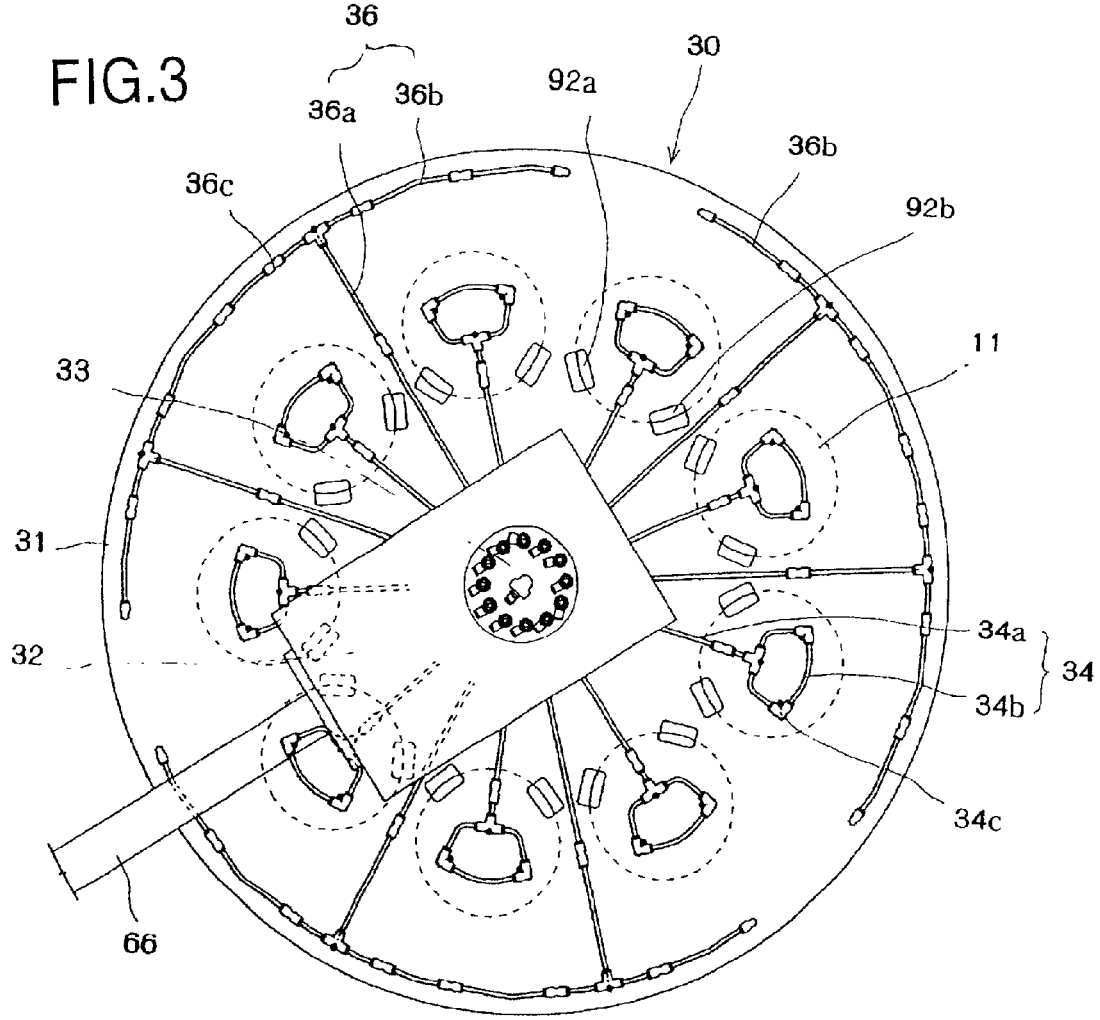
FIG. 3 is a plan view of the sucking mechanism.
Figure 4:
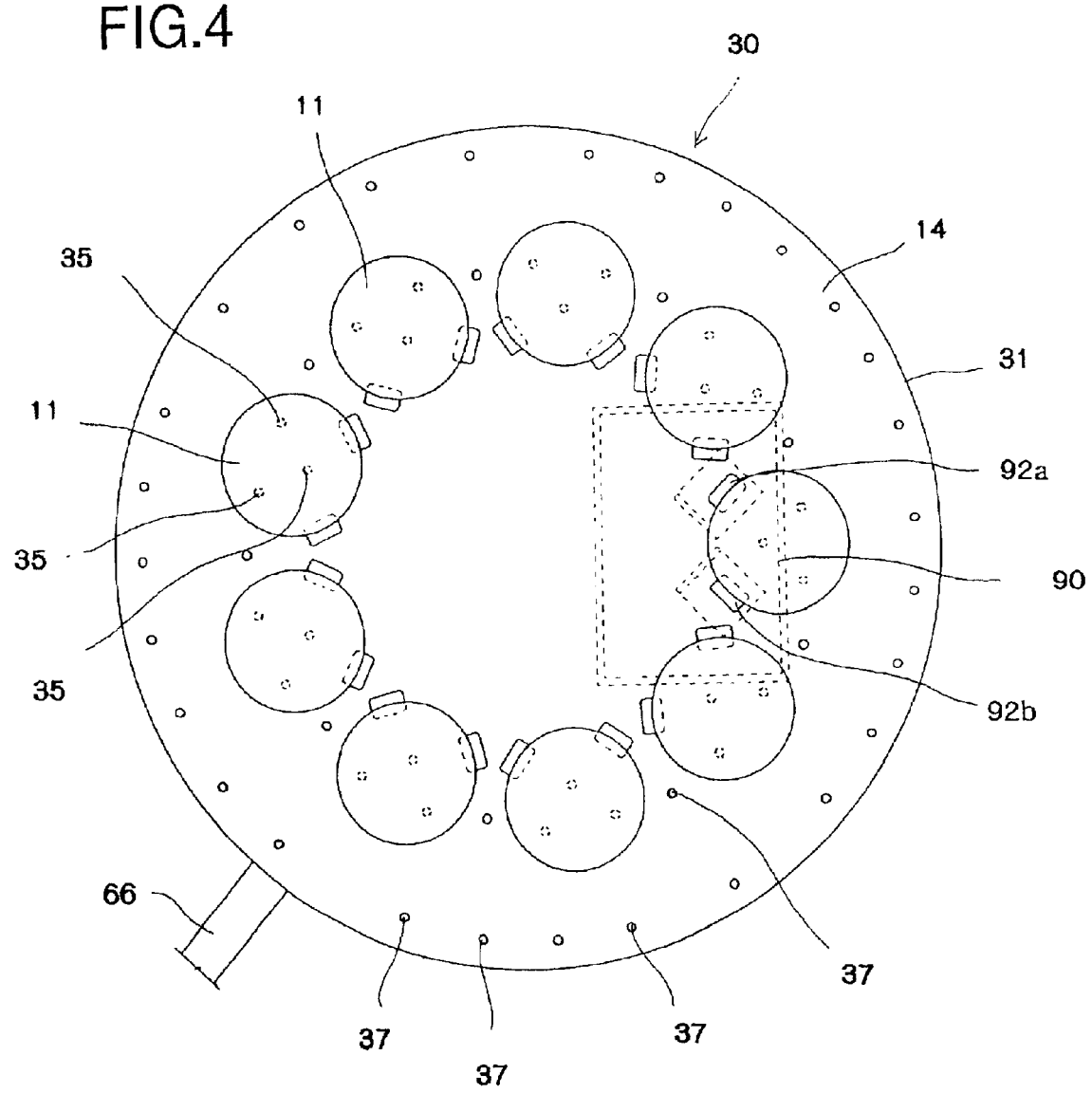
FIG. 4 is a bottom view of the sucking mechanism.

FIG. 3 is a plan view of the sucking mechanism 30, and FIG. 4 is a bottom view thereof seen from the sucking face side.

The sucking board 31 sucks and holds the carrier 14 and the work pieces 11 by air suction. The carrier 14 has a plurality of through-holes in each of which the work piece 11 is inserted. The work pieces 11 are correctly positioned in the through-holes and sucked by the sucking board 31. In the present embodiment, the carrier 14 has nine through-holes, which are arranged in the circumferential direction with regular separations. Vacuum circuits 34 for sucking the work pieces 11 and vacuum circuits 36 for sucking the carrier 14 are formed in an upper face of the sucking board 31. The vacuum circuit 34 includes an air tube 34a, which connects the rotary joint 33 to a work piece holding position, and an air tube 34b, which is provided to the work piece holding position. Joint sections 34c connects the air tube 34a to the air tube 34b. Sucking members 35, which directly contacts and holds the work piece 11, are respectively provide to the joint sections 34c. The sucking members 35 have opening sections, which are opened in the sucking face of the sucking board 31. In the present embodiment, three sucking members 35 are provided for each work piece 11.

The vacuum circuit 36 for holding the carrier 14 to the sucking board 31 is constituted by air tubes 36b, which are arranged along an outer edge of the sucking board 31, and air tubes 36a, which respectively connects the air tubes 36b to the rotary joint 33. The air tubes 36b are connected by joint sections 36c, which are provided with regular separations. The joint sections 36c are also provided to a mid part of each air tube 36a. Sucking members 37, which directly contacts and holds the carrier 14, are respectively provide to the joint sections 36c. The sucking members 37 have opening sections, which are opened in the sucking face of the sucking board 31.

By the vacuum circuits 34 and 36 of the sucking mechanism 30, the carrier 14 can be held on the sucking board 31, and the work pieces 11 can be inserted and held in the through-holes of the carrier 14, so that the work pieces 11 also can be sucked and held on the sucking board 31.

In the abrasive system shown in FIG. 1, the work pieces feeding machine of the present invention, which inserts and positions the work pieces 11 in the through-holes of the carrier, which has been held on the sucking board 31, is applied to the feeding mechanism 80. The feeding mechanism 80 shown in FIG. 1 includes: cassette setting sections at which cassettes 82, in which the work pieces 11 have been stored, are set; a work piece take-out section 84 for taking the work piece 11 from the cassette 82; a centering section 86 for centering the work piece 11, which has been taken out from the cassette 82 by the work piece take-out section 84; a loading section 88 for feeding the work piece 11, which has been centered by the centering section 86, into the through-hole of the carrier 14, which has been held by the sucking board 31; a positioning unit 90 for detecting amount of displacement of the work piece 11 with respect to the through-hole of the carrier 14; and an operation panel 95.

Figure 5:
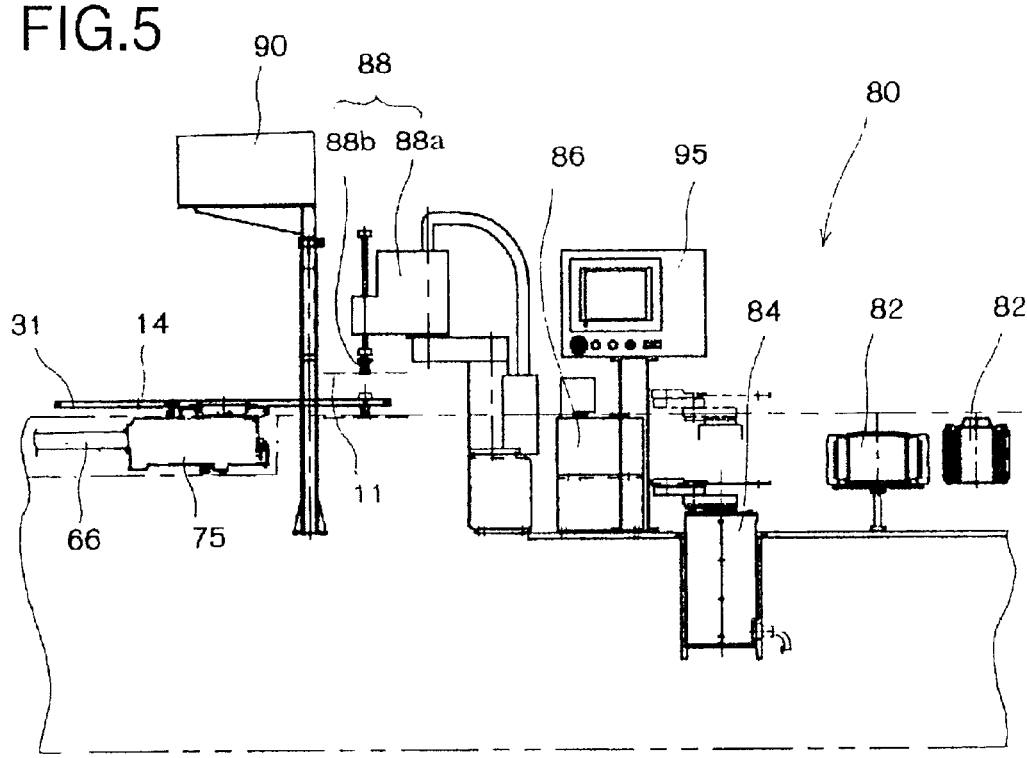
FIG. 5 is a side view of a feeding mechanism.

FIG. 5 is the feeding mechanism 80 seen from a side face. The work piece take-out section 84 has a take-out arm capable of moving in the vertical direction. The take-out arm pulls the work pieces 11, which have been piled in the cassette 82 with regular separations, out from the cassette 82 in order. The center of the work piece 11, which has been taken out from the cassette 82 by the work piece take-out section 84, is correctly positioned by the centering section 86, then the work piece 11 is headed in a predetermined direction. A chuck 88b is provided to a front end of a turning arm 88a of the loading section 88. The chuck 88b sucks and holds the work piece 11, which has been correctly positioned by the centering section 86, so as to feed the work piece 11 to the carrier 14.

The feeding mechanism 80 sets the work pieces 11 to the sucking board 31 is executed in a state, in which the sucking mechanism 30 has been moved to a work piece feeding position (the position of the sucking board 31 in FIG. 1) by the conveying mechanism 60. The sucking board 31 is horizontally held with its sucking face headed upward. The carrier 14 has been previously held by the sucking board 31 by air suction, the feeding mechanism 80 feeds the work pieces 11 to the through-holes of the carrier 14 one by one. Since the through-holes are arranged in the circumferential direction, the sucking board 31 is rotated, the through-holes are correctly positioned in order, so that the loading section 88 sets the work pieces 11 in the through-holes respectively.

The loading section 88 sets the work piece 11 in the carrier 14 with the steps of: sucking and holding the work piece 11, which has been correctly positioned by the centering section 86, by the chuck 88b of the loading section 88; moving the work piece 11 to a position immediately above the through-hole of the carrier 14; holding the work piece 11 at the position; detecting the amount of displacement of the work piece 11 with respect to the through-hole by the positioning unit 90; and controlling the loading section 88 so as to correct the displacement of the work piece 11 in the through-hole. Namely, the loading section 88 detects the displacement between the work piece 11 and the through-hole at a detecting position, then the position of the work piece 11 is corrected to place the correct position.

In the present embodiment, the positioning unit 90 detects the displacement of the work piece 11 with respect to the through-hole of the carrier 14 by optically detecting a position of an outer edge of the work piece 11 and a position of an inner edge of the through-hole of the carrier 14. The amount of the displacement can measured on the basis of the detected positions of both edges.

In FIGS. 3 and 4, the sucking board 31 has windows 92a and 92b for detecting the displacement. The windows 92a and 92b are opened so as to partially expose the inner edge of the through-hole of the carrier 14. By forming the windows 92a and 92b with an angular separation of 90°, two parts of the inner edge of each through-hole can be seen. Light emitted from a position under the carrier 14 can pass through the windows 92a and 92b, so that the light transmitted through the carrier 14 can be received.

Figure 6:
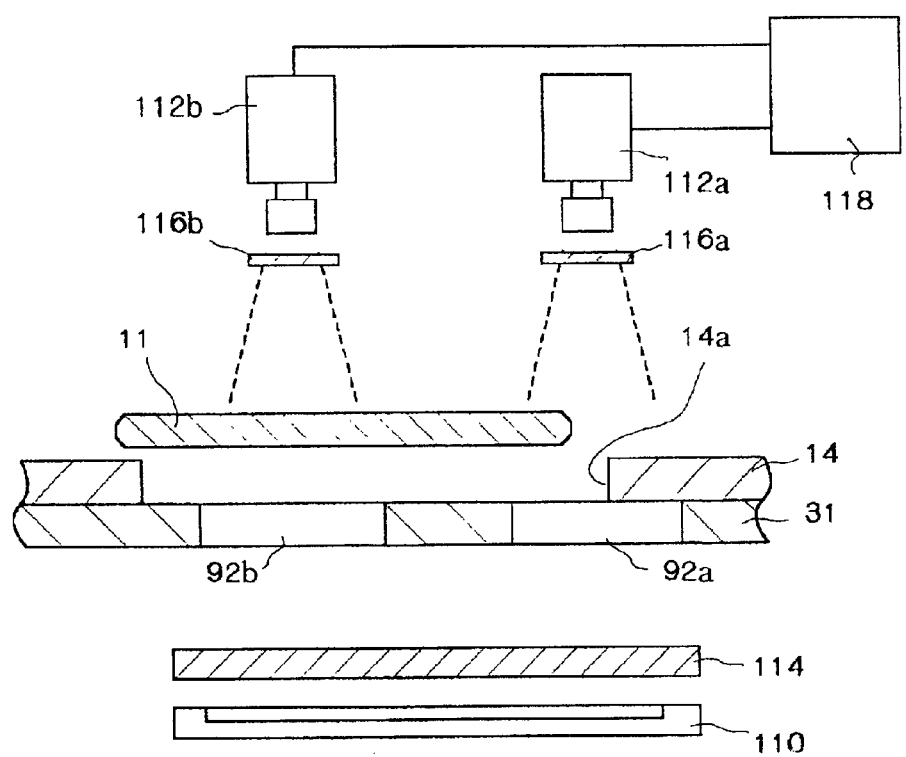
FIG. 6 is an explanation view of a positioning unit.

FIG. 6 shows an arrangement of the work piece 11, the carrier 14, a light source section 110 and cameras 112a and 112b in the positioning unit 90. The cameras 112a and 112b detects the positions of the work piece 11 and the through-hole. In FIG. 6, the work piece 11 has been moved to the detecting position by the loading section 88. The work piece 11 and the carrier 14 are sandwiched between the light source section 110 and the cameras 112a and 112b. The cameras 112a and 112b receive direct light from the light source section 110 and transmitted light transmitted through the carrier 14.

The light source section 110 uniformly lightens the windows 92a and 92b of the sucking board 31. The cameras 112a and 112b are respectively located above the windows 92a and 92b and respectively measure the displacement of the work piece 11 with respect to the through-hole 14a in the windows 92a and 92b.

A polarizing filter 114 is provided between the light source section 110 and the sucking board 31. Polarizing filters 116a and 116b are respectively provided to the cameras 112a and 112b. In the present embodiment, a transmission axis (linear polarized light) of the polarizing filter 114, which is provided on the light source section 110 side, is parallel to transmission axes (linear polarized light) of the polarizing filters 116a and 116b, which are provided to the cameras 112a and 112b. The light from the light source section 110 removes light diffused by the carrier 14, so that the inner edge of the through-hole 14a can be correctly known on the basis of difference of light intensity between the direct light, which directly reaches the cameras 112a and 112b, and the transmitted light, which is transmitted through the carrier 14 and reaches the cameras 112a and 112b.

An image processing section 118 measures the amount of displacement of the work piece 11 with respect to the through-hole 14a on the basis of the positions of the outer edge of the work piece 11 and the positions of the inner edge of the through-hole 14a of the carrier 14, which are detected by the cameras 112a and 112b.

Figure 7:
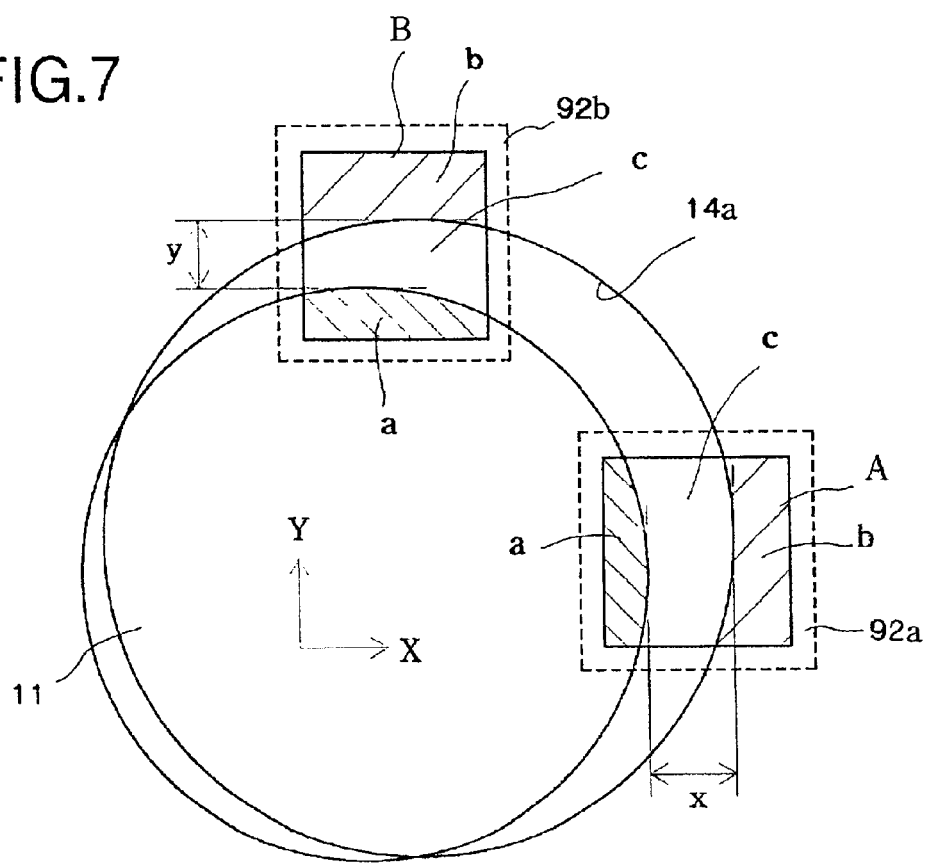
FIG. 7 is an explanation view showing a method of detecting amount of displacement of a work piece with respect to a through-hole.

In FIG. 7, the work piece 11 and the through-hole 14a are seen by the cameras 112a and 112b. A symbol "A" stands for a visual field of the camera 112a; a symbol "B" stands for that of the camera 112b. As described above, the windows 92a and 92b are arranged with the angular separation of 90° and the visual fields "A" and "B" of the cameras 112a and 112b, in each of which the work piece 11 and the through-hole 14a are seen, are also angularity separated 90°. The outer edge of the work piece 11 and the inner edge of the through-hole 14a are partially seen in the visual fields "A" and "B" of the cameras 112a and 112b, so the image processing section 118 measures the amount of displacement of the work piece 11 with respect to the through-hole 14a on the basis of the positions of the outer edge of the work piece 11 and the positions of the inner edge of the through-hole 14a in the visual fields "A" and "B".

To measure the amount of displacement, the image processing section 118 detects the outermost position of the outer edge of the work piece 11 and the innermost position of the inner edge of the through-hole 14a in each visual field "A" and "B". The distance "x" between the outermost position and the innermost position in the visual field "A" is regarded as the amount of displacement in the X-direction; the distance "y" between the outermost position and the innermost position in the visual field "B" is regarded as the amount of displacement in the Y-direction.

The positions of measuring the amount of displacement of the work piece 11 with respect to the through-hole 14a are angularity separated 90°, so the measured values "x" and "y" indicate the displacement of the center of the work piece 11, in the X- and the Y-directions, with respect to the center of the through-hole 14a. The loading unit 88 is controlled to make the values "x" and "y" small so as to correctly set the work piece 11 in the through-hole 14a of the carrier 14. Note that, an inner diameter of the through-hole 14a is slightly greater than an outer diameter of the work piece 11 so as to set the work piece 11 in the through-hole 14a. Therefore, the work piece 11 is set in the through-hole 14a on the basis of the diameter difference.

In the present embodiment, the positioning unit 90 has the polarizing filter 114, which is provided on the light source section side, and the polarizing filters 116a and 116b, which are provided to the cameras 112a and 112b, so that the position of the through-hole 14a of the carrier 14, which is made of a half-transparent plastic material, can be detected with high accuracy.

Figure 8:
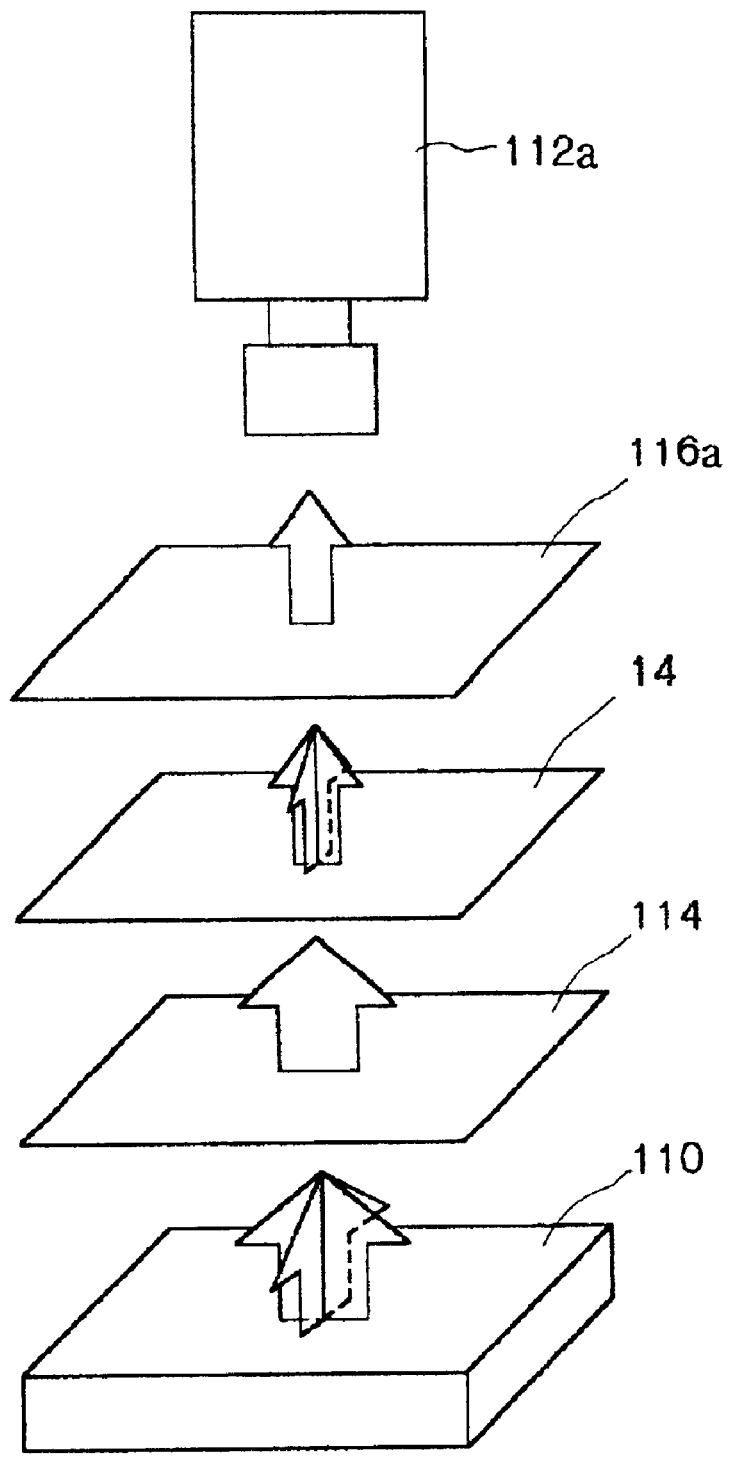
FIG. 8 is an explanation view showing function of polarizing filters of the positioning unit.

Function of the polarizing filters 114 and 116a of the positioning unit 90 will be explained with reference to FIG. 8. The light emitted from the light source section 110 is polarized by the polarizing filter 114 and enters the carrier 14. In the carrier 14, the polarized light is diffused and polarized in the polarizing direction. The polarizing filter 116a passes only the transmitted light corresponding to its transmission axis, so that intensity of the light received by the camera 112a is lower than that of the direct light.

In the visual fields "A" and "B" shown in FIG. 7, areas "a" are shaded by the work piece 11, so they look black; areas "b" are shaded by the half-transparent carrier 14, so they look slightly dark; gaps "c" between the work piece 11 and the carrier 14 are bright areas. By using the polarizing filters 114, 116a and 116b, the difference of light intensity between the areas "b" and the gaps "c" can be made clear, so that the half-transparent carrier 14 can be detected securely.

The method of detecting positions of an opaque body and a half-transparent body by using the polarizing filters is not limited to the present embodiment. Another embodiment will be explained with reference to FIGS. 9A and 9B.

Figure 9A:
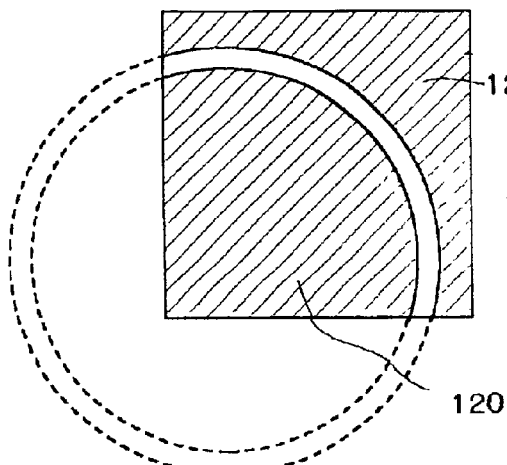
FIGS. 9A and 9B are explanation views showing another method of detecting the amount of displacement of the work piece with respect to the through-hole.

In FIG. 9A, a work piece 120 and a carrier 122 are made of a half-transparent material. i.e. a semi-transparent material. A transmission axis of a polarizing filter (not shown) on the light source section side is parallel to that of another polarizing filter on the camera side (not shown). The light from the light source section is diffused in the work piece 120 and the carrier 122 so that the light intensity of the light transmitted through the work piece 120 and the carrier 122 is reduced.

Figure 9B:
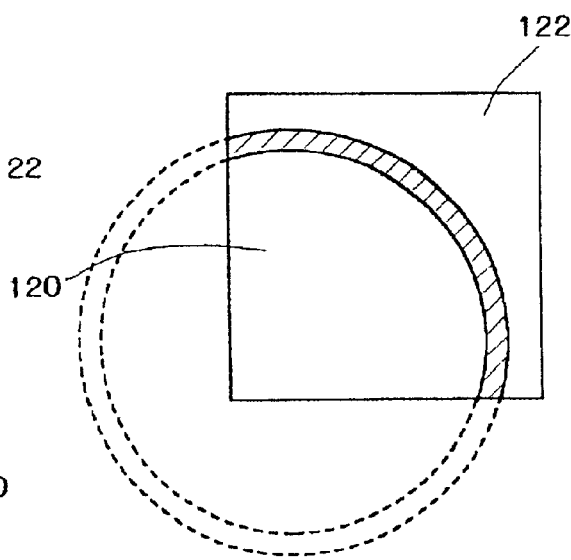

In FIG. 9B, the work piece 120 and the carrier 122 are made of a half-transparent material. A transmission axis of a polarizing filter (not shown) on the light source section side is perpendicular to that of another polarizing filter on the camera side (not shown). The direct light from the light source section is shaded by the polarizing filter so that a gap between the work piece 120 and the carrier 122 look dark; transmission axes of the light transmitted through the work piece 120 and the carrier 122 are displaced, so that the light intensity of the light transmitted through the work piece 120 and the carrier 122 are greater than that of the light passing through the gap.

Even the work piece and the carrier are made of materials having different optical properties, they can be securely detected by selecting arrangement of the transmission axes of the polarizing filters, e.g., parallel, perpendicular.

In the former embodiment, two cameras 112a and 112b are used, but one camera may be used in the embodiment shown in FIGS. 9A and 9B. If an object body to be detected is large, the amount of displacement can be efficiently measured by two cameras. On the other hand, if the object body is small or high detecting accuracy is not required, the amount of displacement may be measured by one camera.

In the above described embodiments, the displacement is detected by using the transmitted light, so the displacement can be securely detected even if the surface of the work piece is like a mirror face or a color of the carrier is milk white.

In the case of using the transmitted light, an incident angle of the light, which is emitted from the light source section, with respect to the carrier is the right angle. With this incident angle, bad influence of extraneous light can be reduced, so that the amount of displacement can be detected with high accuracy.

Figure 10A:
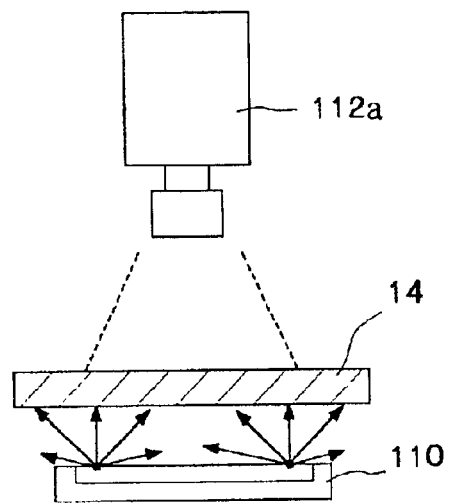
FIGS. 10A and 10B are explanation views showing arrangement of a lighting section of the positioning section.
Figure 10B:
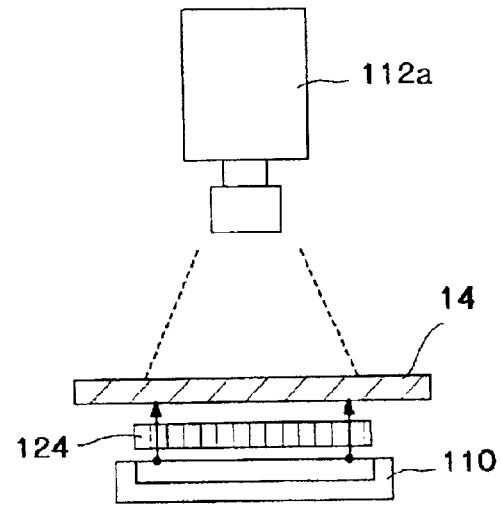

In FIG. 10A, the light source section 110 is provided close to the carrier 14, and the light is diagonally emitted toward the carrier 14. To prevent the diagonal emission, the light source section 110 may be separated away from the carrier 14. Further, as shown in FIG. 10B, a light control film 124 may be provided between the light source section 110 and the carrier 14. By using the light control film 124, the incident angle of the light with respect to the carrier 14 can be the right angle.

Figure 11:
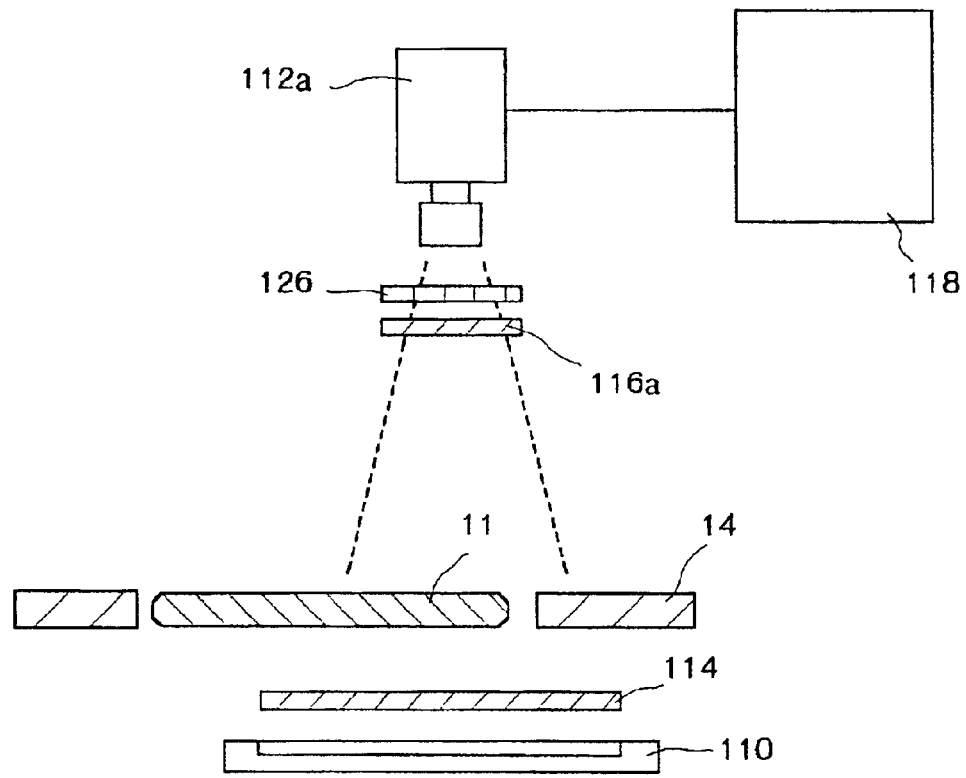
FIG. 11 is an explanation view showing another example of the positioning unit.

In FIG. 11, a monochromatic LED is used as the light source section 110; a color filter 126, which passes the monochromatic light from the LED, is provided to the camera 112a. In the case that the monochromatic light is not used as the light source section 110, the same color filters may be provided to the light source section 110 and the camera 112a.

In the above describe embodiments, the positioning unit 90 is capable of detecting the positions of the work piece 11 and the through-hole 14a of the carrier 14 with high accuracy, and the position of the work piece 11 in the through-hole 14a can be precisely corrected.

To set the work piece 11 in the through-hole 14a of the carrier 14, the sucking board 31 is turned to coincide the through-hole 14a with a work piece setting position. It is very difficult to correctly coincide the through-hole 14a with the work piece setting position. Further, it is also difficult to correctly chuck the work piece 11 by the loading unit 88. Usually, a clearance or a gap between the outer edge of the work piece 11 and the inner edge of the through-hole 14a is about 0.5 mm, it is important to precisely adjust the clearance with measuring the clearance so as to correctly set the work piece 11 in the carrier 14.

When the work piece 11 has been chucked and conveyed from the centering section 86 to the detecting position located above the work piece setting position, the work piece 11 is held at the detecting position. Amount of displacement of the work piece 11 with respect to the setting position is greater than an allowable error of positioning the carrier 14 and an allowable error of chucking the work piece 11.

The amount of displacement of the work piece 11 in the X- and the Y-directions are optically measured. The loading unit 88 corrects or adjusts the position of the work piece 11 with measuring the amount of displacement thereof. The work piece 11 is moved downward, with correcting the position, until reaching the carrier 14. Upon reaching or setting the work piece 11 on the carrier 14, the sucking board 31 is rotated so as to set other work pieces 11 into other through-holes 14a of the carrier 14 in order. Each of the work pieces 11 is set in each of the through-holes 14a, in order, with measuring the amount of displacement and correcting the position as well. By repeating the steps for setting the work piece 11, the work pieces 11 can be respectively set in all of the through-holes 14a of the carrier 14.

In the present embodiment, when the work piece 11 is set in the through-hole 14a, the sucking board 31 is rotated in both circumferential directions. An anti-twisting mechanism is provided to the rotary joint 33 of the sucking board 31, so air tubes constituting the vacuum circuits are not twisted even if the sucking board 31 is rotated. With this structure, the sucking board 31 is rotated in one direction to set the work pieces 11 in a half of the through-holes 14a, then the sucking board 31 is rotated in the opposite direction to set the work pieces 11 in the rest of the through-holes 14a.

After the work pieces 11 are set in all of the through-holes 14a, the carrier 14 and the work pieces 11 are held on the sucking board 31 by air suction, then the sucking board 31 is conveyed to the abrasive machine 10a or 10b so as to abrade the work pieces 11.

In the abrasive system shown in FIG. 1, the conveying mechanism 60 turns the sucking board 31 in the horizontal plane so as to convey and feed the carrier 14 and the work pieces 11 to the abrasive machine 10a or 10b. When the work pieces 11 are set in the carrier 14, the sucking face of the sucking board 31 is headed upward, so the sucking face must be headed downward when the carrier 14 and the work pieces 11 are set in the abrasive machine. Thus, in the abrasive system, the conveying mechanism 60 moves the sucking board 31 upward and inverts the sucking board 31 so as to head the sucking face downward.

Upon inverting the sucking board 31, the conveying mechanism 60 moves the sucking board 31 so as to set the carrier 14 and the work pieces 11 in the abrasive machine.

After the work pieces 11 are completely abraded in the abrasive machine, an abrasive plate of the abrasive machine is moved upward, then the sucking board 31 is moved into the abrasive machine so as to suck and hold the carrier 14 and the abraded work pieces 11. Upon holding the carrier 14 and the abraded work pieces 11 by the sucking board 31, the sucking board 31 is turned, by the conveying mechanism 60, to move from the abrasive machine to the accommodating mechanism 100.

In the accommodating mechanism 100, the abraded work pieces 11 are transferred from the sucking board 31 to a tray 102, then accommodated into cassettes 106a and 106b via water shooters 104a and 104b.

On the other hand, the sucking board 31, which has released the carrier 14 and the abraded work pieces 11, is moved to the feeding mechanism 80, then inverted to face the sucking face upward so as to set new work pieces 11 thereon. To set the new work pieces 11, the positioning unit 90 optically measured the amount of displacement of each work piece 11 with respect to each through-hole 14a of the carrier 14 as well. The new work pieces 11 are also supplied from the cassette 82 to the sucking board 31, one by one, so as to abrade them in the abrasive machines 10a and 10b.

Note that, the abrasive system shown in FIG. 1 includes two abrasive machines 10a and 10b, and one sucking mechanism 30 and one conveying mechanism 60. The abrasive system is one of examples, so the present invention can be applied to other systems, in which a work piece is conveyed to a machine together with a carrier.

The invention may be embodied in other specific forms without departing from the spirit or essential characteristics thereof. The present embodiments are therefore to be considered in all respects as illustrative and not restrictive, the scope of the invention being indicated by the appended claims rather than by he foregoing description and all changes which come within the meaning and range of equivalency of the claims are therefore intended to be embraced therein.

What is claimed is:

1. A work piece feeding machine which sets a work piece into a through-hole of a carrier and feeds the carrier holding the work piece to a machine for further treatment, comprising:

a loading unit for feeding the work piece to the through-hole of the carrier; and a positioning unit for detecting an amount of displacement of the work piece with respect to the through-hole at a detecting position and correcting the position of the work piece in the through-hole on the basis of the detected amount of the displacement thereof, wherein the positioning unit includes:

a lighting source section provided on the work piece side or the carrier side, the lighting source section directing polarized light on the work piece and the carrier at the detecting position;

at least one camera provided on the carrier side or the work piece side, the at least one camera receiving the polarized light from the lighting source section so as to catch images of an outer edge of the work piece and an inner edge of the through-hole in a visual field thereof; and an image processing section for measuring the amount of displacement of the work piece with respect to the through-hole on the basis of positions of the outer edge of the work piece and the inner edge of the through-hole in the visual field, the image processing section detecting the amount of displacement of the work piece with respect to the through-hole on the basis of difference between intensity of direct light, which is emitted from the lighting source section via a gap between the outer edge of the carrier and the inner edge of the through-hole, and intensity of transmitted light, which has been transmitted through at least one of the work piece and the carrier.

2. The work piece feeding machine according to claim 1, wherein the at least one camera comprises a plurality of cameras which are located with an angular separation of 90° and are capable of detecting a center of the work piece and a center of the through-hole of the carrier.

3. The work piece feeding machine according to claim 1, wherein the lighting source section and the at least one camera have polarizing filters.

4. An abrasive system, comprising:

an abrasive machine for abrading a work piece;

a sucking mechanism for holding the carrier by vacuum means, the sucking mechanism including a sucking board whose shape is similar to that of the carrier;

a work piece feeding machine according to claim 1;

an accommodating mechanism for accommodating the work piece abraded by the abrasive machine; and a conveying mechanism for conveying the sucking board to the abrasive machine, the work piece feeding machine and the accommodating mechanism.

5. The abrasive system according to claim 4, wherein the conveying mechanism comprises:
   a carrier arm for holding the sucking board;
   a turning unit for turning the sucking board in a horizontal plane so as to convey the sucking board to the abrasive machine, the work piece feeding machine and the accommodating mechanism;
   an vertical drive unit for vertically moving the sucking board; and
   an inverting unit for inverting the sucking board.

6. The work piece feeding machine according to claim 1, wherein the lighting source section is arranged on the work piece side and the at least one camera is arranged on the carrier side.

7. The work piece feeding machine according to claim 1, wherein the lighting source section is arranged on the carrier side and the at least one camera is arranged on the work piece side.

8. The work piece feeding machine according to claim 1, wherein the at least one camera comprises a plurality of cameras.

9. The work piece feeding machine according to claim 1, further comprising a first polarizing filter arranged in front of the lighting source section and a second polarizing filter arranged in front of each of the at least one camera, the first polarizing filter having a transmission axis parallel to a transmission axis of the second polarizing filter.

* * * * *